(12) United States Patent
Park et al.

(10) Patent No.: US 8,776,718 B2
(45) Date of Patent: Jul. 15, 2014

(54) DEPOSITION MASK AND MASK ASSEMBLY HAVING THE SAME

(75) Inventors: Chong-Hyun Park, Daegu (KR); Tae-Hyung Kim, Daegu (KR); Il-Hyun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 330 days.

(21) Appl. No.: 12/980,158

(22) Filed: Dec. 28, 2010

(65) Prior Publication Data
US 2011/0179996 A1    Jul. 28, 2011

(30) Foreign Application Priority Data

Jan. 28, 2010 (KR) .................. 10-2010-0007778

(51) Int. Cl.
*B05C 11/00* (2006.01)
(52) U.S. Cl.
USPC .......................................... 118/504
(58) Field of Classification Search
None
See application file for complete search history.

(56) References Cited

U.S. PATENT DOCUMENTS

| | | | | |
|---|---|---|---|---|
| 2003/0221614 A1* | 12/2003 | Kang et al. | ..... | 118/504 |
| 2004/0123799 A1* | 7/2004 | Clark | ..... | 118/504 |
| 2006/0051936 A1* | 3/2006 | Koike | ..... | 438/459 |
| 2006/0103289 A1* | 5/2006 | Kim et al. | ..... | 313/402 |
| 2009/0322215 A1* | 12/2009 | Sung et al. | ..... | 313/504 |

FOREIGN PATENT DOCUMENTS

| | | |
|---|---|---|
| CN | 1471341 A | 1/2004 |
| CN | 102131949 A | 7/2011 |
| KR | 10-2003-0093959 A | 12/2003 |

\* cited by examiner

*Primary Examiner* — Dah-Wei D Yuan
*Assistant Examiner* — Jethro Pence
(74) *Attorney, Agent, or Firm* — Birch, Stewart, Kolasch & Birch, LLP

(57) ABSTRACT

A deposition mask and mask assembly having the same capable of improving deposition efficiency is discussed. Both ends of the deposition mask have a pointed cross section such that at least a part of the neighboring deposition masks overlap each other at a boundary therebetween when deposition masks are consecutively arranged in parallel.

7 Claims, 4 Drawing Sheets

DEPOSITION MASK AND MASK ASSEMBLY HAVING THE SAME

This application claims the benefit of Korean Patent Application No. 10-2010-0007778, filed on, Jan. 28, 2010, which is hereby incorporated by reference as if fully set forth herein.

BACKGROUND OF THE INVENTION

1. Field of the Invention

The present invention relates to a deposition mask and a mask assembly having the same, and more particularly, to a deposition mask, which can achieve an improvement in deposition efficiency of organic matter in a process of forming an organic layer of an organic light emitting display device, and a mask assembly having the same.

2. Discussion of the Related Art

Recently, the increasing prominence of information technology has led to advances in display technology for visually displaying electrical information signals. Accordingly, a variety of flat panel displays having superior performance including slim design, low weight and low power consumption have been developed and rapidly replaced conventional Cathode Ray Tubes (CRT).

Representative examples of flat panel displays may include a Liquid Crystal Display (LCD), Plasma Display Panel (PDP), Field Emission Display (FED), Electro Luminescent Display (ELD), Electro-Wetting Display (EWD), and Organic Light Emitting Diode (OLED) display.

Of the aforementioned displays, an organic light emitting diode (hereinafter, referred to as "OLED") displays an image using organic light emitting diodes. An OLED is designed to generate light of a specific wavelength by exciton energy generated by recombination of electrons and holes. Such an OLED has advantages including superior display characteristics, such as high contrast ratio and fast response time, and easy realization of a flexible display, and, it may be classed as such an ideal next generation display.

In a general OLED, an active area in which a plurality of subpixels is arranged in a matrix and a remaining area, referred to as an inactive area, are defined. Each subpixel includes a thin-film transistor and an organic light emitting diode. The organic light emitting diode includes a first electrode, an organic layer, and a second electrode. The organic layer includes a hole injection layer, a hole transport layer, a light emitting layer, an electron transport layer, and an electron injection layer. The OLED having the above described configuration displays an image by applying a voltage of several volts to the first electrode and the second electrode. Thereby, current passing through the organic layer induces emission of light. That is, the OLED displays an image using the principle of emitting light using remnant energy which is generated by an exciton falling back to a ground state. The exciton is generated by recombination of hole and electron injected from the first electrode and the second electrode.

Meanwhile, in an organic layer forming process, a mask assembly is used to form light emitting regions corresponding to the subpixels. In this case, the mask assembly includes a frame coupled to the deposition mask and a deposition mask which is formed of a metal or plastic thin film and includes an aperture area corresponding to the active area and an intercepting area outside of the aperture area. In the mask assembly, the deposition mask is flat in an unfolded state thereof and is coupled to the frame via, e.g., welding. The frame is configured to maintain the flat state of the deposition mask.

To achieve improved yield by simultaneously manufacturing a plurality of organic light emitting displays, or to increase a size of an organic light emitting display, a size of a substrate is gradually increasing. This necessitates an increase in the size of the mask assembly to correspond to the substrate.

As described above, when a single deposition mask constitutes a large mask assembly, the deposition mask should have a large size. Therefore, even if the deposition mask is coupled to the frame in a stretched state, the deposition mask may sag under the weight. This sagging deposition mask may not come into close contact with the substrate, thereby making it difficult to perform deposition of organic matter according to a designed pattern. Moreover, if excessive tensile force is applied to the deposition mask to prevent the sag phenomenon, the tensile force may deform a pattern of the deposition mask, making it difficult to perform deposition of organic matter according to a designed pattern.

To solve the above described problems, constituting a large mask assembly corresponding to a large substrate using a plurality of deposition masks (hereinafter, referred to as "split deposition masks") has been attempted. Specifically, in the mask assembly, a plurality of split deposition masks is consecutively arranged in parallel and is coupled to the frame via, e.g., welding. In this case, each of the plurality of split deposition masks has a relatively small size, thereby being free from sagging. However, gaps may occur at boundaries between the split deposition masks, and organic matter may pass through the gaps, thereby being unintentionally deposited outside the light emitting regions. This may deteriorate deposition efficiency of organic matter in a subsequent organic matter deposition process, and also, may deteriorate uniformity of an organic light emitting display. Therefore, the mask assembly including the plurality of split deposition masks needs to shield the gaps.

SUMMARY OF THE INVENTION

Accordingly, the present invention is directed to a deposition mask and a mask assembly having the same that substantially obviate one or more problems due to limitations and disadvantages of the related art.

An object of the present invention is to provide a deposition mask having a configuration to shield gaps at boundaries between a plurality of consecutively arranged deposition masks, and a mask assembly having the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a deposition mask in which an aperture area for transmission of organic matter and an intercepting area corresponding to an area outside of the aperture area is provided, wherein both ends of the deposition mask respectively have an asymmetric horn-shaped cross section.

In accordance with another aspect of the present invention, a mask assembly includes a plurality of deposition masks in which an aperture area for transmission of organic matter and an intercepting area corresponding to an area outside the aperture area are defined, both ends of each deposition mask respectively having an asymmetric horn-shaped cross section, and a frame coupled with the plurality of deposition masks.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a deposition mask and a mask assembly according to an embodiment of the present invention will be described in detail with reference to the accompanying drawings.

First, an organic matter deposition process using a mask assembly will be described.

Figure 1:
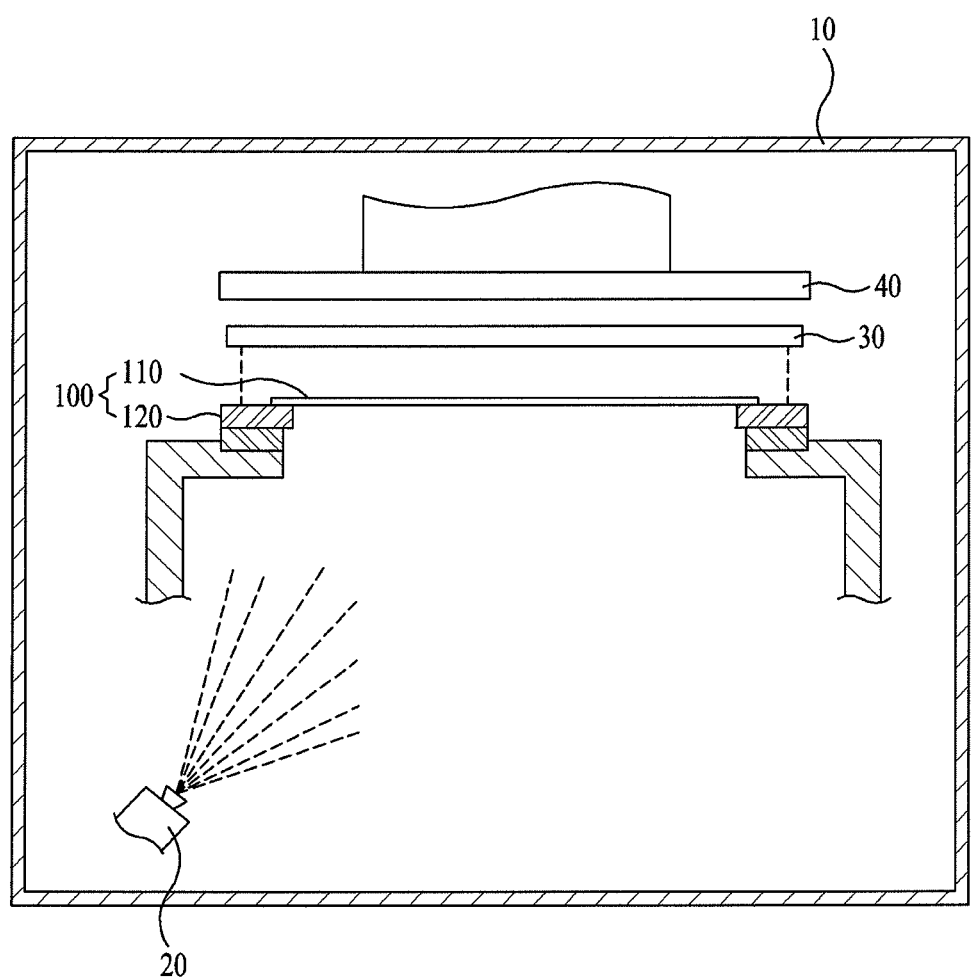
FIG. 1 is a sectional view illustrating equipment for implementation of an organic matter deposition process according to an embodiment of the present invention.

FIG. 1 is a sectional view illustrating equipment for implementation of the organic matter deposition process according to the embodiment of the present invention.

As illustrated in FIG. 1, the organic matter deposition equipment includes a chamber 10, the interior of which is kept under vacuum, a deposition source 20 disposed in the chamber 10 to discharge organic matter, a mask assembly 100 disposed above the deposition source 20, a substrate 30 disposed above the mask assembly 100, and a magnet unit 40 disposed opposite the mask assembly 100 with the substrate 30 interposed therebetween.

The interior of the chamber 10 is held at high vacuum and high temperature while organic matter is deposited on the substrate 30. In this case, to maintain the high vacuum within the chamber 10, although not illustrated in the drawing, a vacuum pump, such as a Turbo Molecular Pump (TMP), may be disposed in the chamber 10. Also, although not illustrated, the organic matter deposition equipment may further include, e.g., a thickness monitoring sensor to measure a thickness of deposited organic matter, a controller to control operation of the deposition source 20 according to the measured thickness of the organic matter, and a shutter to intercept the organic matter discharged from the deposition source 20.

The deposition source 20 is disposed in a lower region of the chamber 10 and takes the form of a crucible that boils off the organic matter.

The mask assembly 100 includes a deposition mask 110 to selectively pass the deposited matter, and a polygonal frame 120 coupled to the deposition mask 110. The mask assembly 100 according to the embodiment of the present invention will be described hereinafter in more detail.

The substrate 30 includes an active area in which a plurality of cells is arranged in a matrix, the organic matter being deposited on the active area, and a dummy area corresponding to an area outside of the active area. In this case, the deposition mask 110 of the mask assembly 100 includes an aperture area corresponding to the active area of the substrate 30. Although not illustrated, the organic matter deposition equipment may further include an aligner to align the substrate 30 and the mask assembly 100 with each other within the chamber 10.

Next, the mask assembly 100 and the deposition mask 110 according to the embodiment of the present invention will be described in detail with reference to FIGS. 2 to 4.

Figure 2:
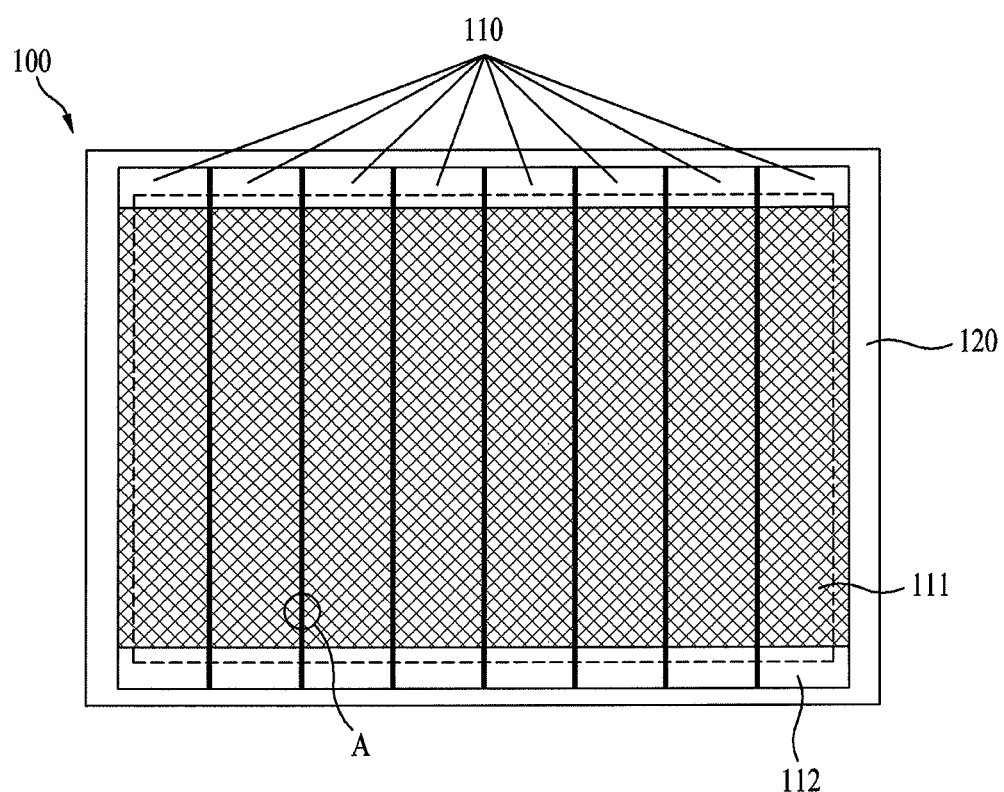
FIG. 2 is a plan view illustrating a mask assembly according to the embodiment of the present invention.
Figure 3:
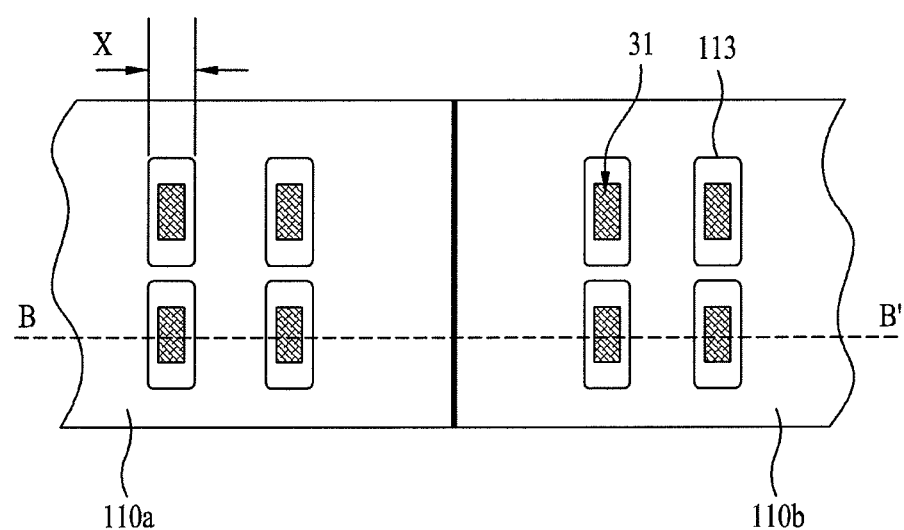
FIG. 3 is an enlarged plan view illustrating a region A of FIG. 2.
Figure 4:
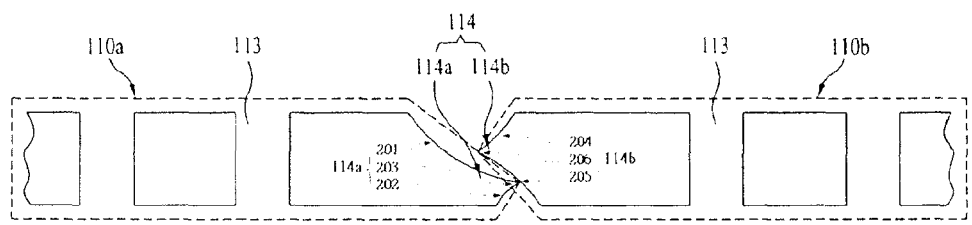
FIG. 4 is a sectional view taken along the line B-B' of FIG. 3.

FIG. 2 is a plan view illustrating the mask assembly according to the embodiment of the present invention, FIG. 3 is an enlarged plan view illustrating a region A of FIG. 2, and FIG. 4 is a sectional view taken along the line B-B' of FIG. 3.

As illustrated in FIG. 2, the mask assembly 100 according to the embodiment of the present invention includes a plurality of deposition masks 110 and the frame 120. Here, each of the plurality of deposition masks 110 includes the aperture area 111 corresponding to the active area of the substrate 30, and an intercepting area 112 corresponding to the area outside of the aperture area 111. The frame 120 takes the form of a polygonal frame (e.g., a rectangular frame in FIG. 2). Upper and lower ends of the frame 120 are coupled to the plurality of consecutively arranged flat deposition masks 110 by, e.g., welding. The plurality of deposition masks 110 is coupled to the frame 120 in a stretched state upon receiving predetermined tensile force. The frame 120, coupled to the stretched deposition masks 110, serve to maintain the tensile force applied to the plurality of deposition masks 110, thereby keeping the deposition masks 110 flat.

As illustrated in FIG. 3, the aperture area 111 of each of the plurality of deposition masks 110 includes a plurality of cell patterns 113. The plurality of cell patterns 113 is provided to correspond respectively to a plurality of cells 31 arranged in the active area of the substrate 30, so as to generate light emitting areas corresponding to the plurality of cells 31. In this case, each cell pattern 113 has a width X greater than that of the corresponding cell 31. Although not illustrated, in consideration of the lifespan of organic matter or the intensity of color illumination, for example, a cell pattern 113 corresponding to a blue cell 31 may have a size greater than cell patterns 113 corresponding to green and red cells 31.

Both ends of each of the plurality of deposition masks 110 have an asymmetric pointed cross section owing to an edge pattern. In this case, the edge pattern may have an asymmetric horn-shaped or asymmetric arrow-shaped cross section. The edge pattern allows at least a part of the two neighboring deposition masks 110 to overlap each other at a boundary between the deposition masks 110 without an increase in thickness. As at least a part of the neighboring deposition masks 110 overlap each other, it is possible to shield a gap between the neighboring deposition masks 110.

For example, as illustrated in FIG. 4, a first deposition mask 110a and a second deposition mask 110b, which are adjacent to each other, are arranged to overlap each other.

Specifically, an edge pattern 114a, formed at one end of the first deposition mask 110a, has a cross section in which a first sector 201 formed at an upper surface and a second sector 202 formed at a lower surface meet each other at a first contact point 203 that is pointed toward the outside of the first deposition mask 110a. In this case, the first sector 201 has a first radius and a first center angle and is formed by etching the upper surface of an edge of the first deposition mask 110a. Also, the second sector 202 has a second radius smaller than the first radius and a second center angle smaller than the first center angle, and is formed by etching the lower surface of an edge of the first deposition mask 110a.

Since the first sector 201 and the second sector 202 have different center angles and different radii, one end of the first deposition mask 110a has an asymmetric horn-shaped (or asymmetric arrow-shaped) cross section. In other words, the first and second sectors 201 and 202 are asymmetric each other, meet at the first contact point 203. The first contact point 203 is protruded from one end of the first deposition mask 110a. Therefore, the cross section of the edge pattern 114a is asymmetric, pointed and protruded horn-shaped (or arrow-shaped). In this case, both ends of the first deposition mask 110a may have different cross sections, or the same cross section. Of course, it is noted that the cross section of the edge pattern 114a foamed at one end of the first deposition mask 110a differs from the cross section of an edge pattern 114b formed at a facing end of the second deposition mask 110b, to allow at least a part of the neighboring deposition masks to overlap each other.

Specifically, the edge pattern 114b formed at one end of the second deposition mask 110b adjacent to the first deposition mask 110a has a cross section in which a third sector 204 formed at an upper surface and a fourth sector 205 formed at a lower surface meet each other at a second contact point 206 that is pointed toward the outside of the second deposition mask 110b. In this case, the third sector 204 has a third radius and a third center angle and is formed by etching the upper surface of an edge of the second deposition mask 110b. Also, the fourth sector 205 has a fourth radius greater than the third radius and a fourth center angle greater than the third center angle, and is formed by etching the lower surface of an edge of the second deposition mask 110b.

Since the third sector 204 and the fourth sector 205 have different center angles and different radii, one end of the second deposition mask 110b has an asymmetric horn-shaped (or asymmetric arrow-shaped) cross section. In other words, the third and fourth sectors 204 and 205 are asymmetric each other, meet at the second contact point 206. The second contact point 206 is protruded from one end of the second deposition mask 110b. The first contact point 203 and the second contact point 206 do not face to etch other. Therefore, the cross section of the edge pattern 114b is asymmetric, pointed and protruded horn-shaped (or arrow-shaped). In this case, both ends of the second deposition mask 110b may be formed to have different cross sections, or the same cross section. Of course, it is noted that the cross section of the edge pattern 114b formed at one end of the second deposition mask 110b differs from the cross section of the edge pattern 114a formed at a facing end of the first deposition mask 110a, to allow at least a part of the edge patterns 114a and 114b the first and second deposition masks 110a and 110b to overlap each other.

In particular, to allow at least a part of the neighboring deposition masks to overlap each other, it is necessary that the contact points 203 and 206 of the edge patterns of the neighboring deposition masks 110a and 110b be placed at different positions each other. Specifically, as illustrated in FIG. 4, one end of the first deposition mask 110a has a cross section in which the first sector 201 and the second sector 202 meet each other at the first contact point 203 placed at a first position, and one end of the second deposition mask 110b has a cross section in which the third sector 204 and the fourth sector 205 meet each other at a second contact points 206 placed at a second position higher than the first position. In this way, the two contacts contact points 203 and 206 do not meet each other at a boundary between the first deposition mask 110a and the second deposition mask 110b, and therefore, at least a part of the two neighboring deposition masks 110a and 110b may overlap each other.

Hereinafter, a process of forming the edge patterns at both ends of the deposition mask 110 according to the embodiment of the present invention will be described.

Figure 5:
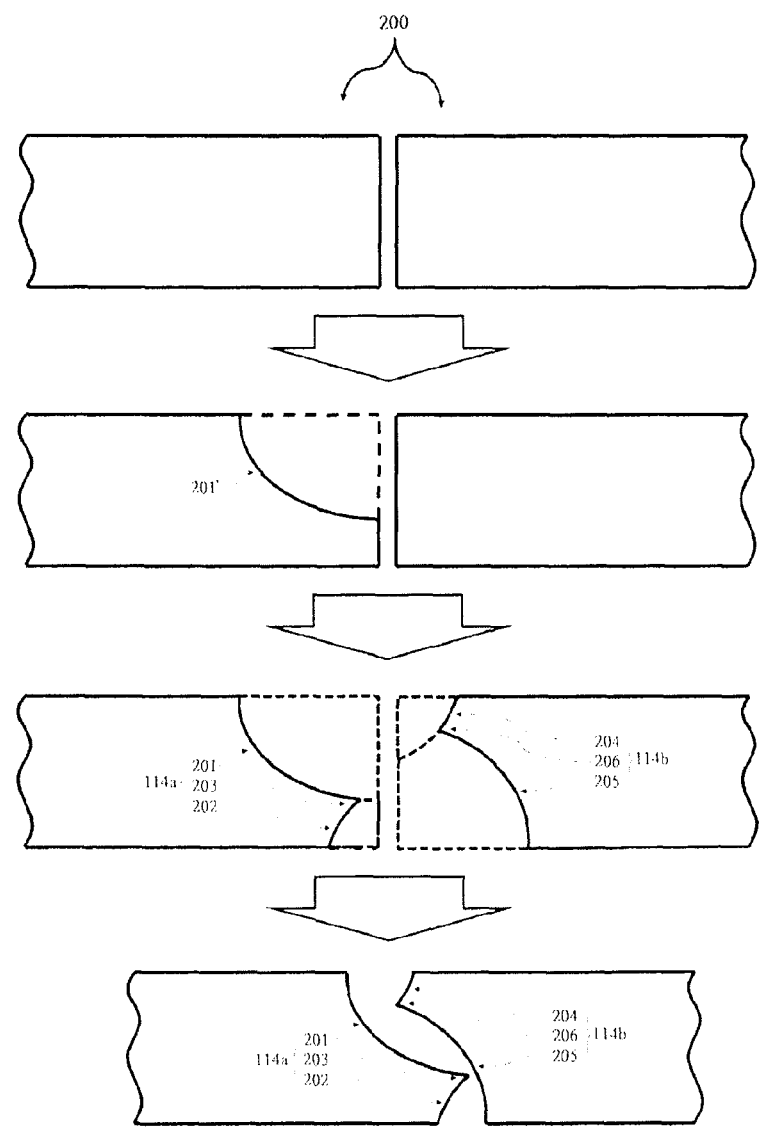
FIG. 5 is views illustrating a process of forming horn-shaped patterns at both edges of a deposition mask according to the embodiment of the present invention.

FIG. 5 is views illustrating a process of forming the edge pattern of the deposition mask according to the embodiment of the present invention.

First, a metal or plastic thin film 200 is prepared. Next, a primary etching process is performed to etch an upper surface of one end of the thin film 200 so as to form a first sector 201 having a first radius and a first center angle. Next, a secondary etching process is performed to etch a lower surface of the end of the thin film 200 so as to form a second sector 202 having a second radius and a second center angle and meeting the first sector 201 at a first contact point 203. Further, a third etching process is performed to etch other end of the upper surface of the film 200 so as to form a third sector 204 having a third radius and a third center angle. Next, a fourth etching process is performed to etch other end of the lower surface of the film 200 so as to form a fourth sector 205 having a fourth radius and a fourth center angle and meeting the third sector 204 at a second contact point 206. A first contact point 203 where the first sector 201 and the second sector 202 meet each other may be controlled according to the etching strength of the primary and secondary etching processes. Further, a second contact point 206 where the third sector 204 and the fourth sector 205 meet each other may be controlled according to the etching strength of the third and fourth etching processes. The first contact point 203 and the second contact point 204 are asymmetric. The primary to fourth etching processes may be wet etching processes to ensure formation of gentle edge patterns.

Cell patterns (113 in FIG. 4) may be formed simultaneously with the edge patterns 114a and 114b by adjusting etching masks in the primary and secondary etching processes.

As is apparent from the above description, according to the embodiment of the present invention, with provision of a mask assembly in which a plurality of deposition masks, each having a relatively small size and low weight, is consecutively arranged in parallel, it may be possible to prevent the deposition masks from sagging under the weight. In this case, both ends of each deposition mask have an asymmetric arrow-shaped or horn-shaped cross section owing to an edge pattern such that at least a part of the consecutively arranged neighboring deposition masks overlap each other at a boundary therebetween. Accordingly, it is possible to shield a gap at the boundary between the consecutively arranged deposition masks. This can allow organic matter to be deposited on a substrate according to design, thereby improving deposition efficiency of the organic matter as well as uniformity of a completed organic light emitting display.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A deposition mask, both ends of the deposition mask having a cross section such that at least a part of the deposition mask and a neighboring deposition mask overlap each other at a boundary therebetween when the deposition mask is consecutively arranged in parallel with the neighboring deposition mask, wherein the cross section of one end of the deposition mask has first and second sectors which are asymmetric and meet each other at a first contact point, a cross section of one end of the neighboring deposition mask has third and fourth sectors which are asymmetric and meet each other at a second contact point, and each of the first and second contact points is asymmetric, pointed and protruded horn-shaped or arrow-shaped, and wherein the first contact point does not face the second contact point.

2. The deposition mask according to claim 1, wherein the cross section of one end of the deposition mask differs from the cross section of a facing end of the neighboring deposition mask.

3. The deposition mask according to claim 1,
wherein the first sector is with a first radius and a first center angle and connected to an upper surface,
the second sector is with a second radius different from the first radius and a second center angle different from the first center angle and connected to a lower surface, and
the first contact point of the deposition mask does not meet the second contact point of the neighboring deposition mask.

4. The deposition mask according to claim 1, wherein the deposition mask includes an aperture area for transmission of organic matter and an intercepting area corresponding to an area outside of the aperture area.

5. The deposition mask according to claim 4, wherein the aperture area includes a plurality of cell patterns corresponding respectively to a plurality of cells arranged in an active area of a substrate.

6. The deposition mask according to claim 5, wherein each cell pattern has a width greater than that of a corresponding cell.

7. The mask assembly according to claim 5, wherein a cell pattern corresponding to a blue cell has a size greater than a cell pattern corresponding to a green or red cell.

* * * * *